United States Patent [19]

Takai et al.

[11] Patent Number: 4,804,964

[45] Date of Patent: Feb. 14, 1989

[54] LORAN-C SIGNAL RECEIVING APPARATUS

[75] Inventors: Hideo Takai, Yokohama; Hiroshige Fukuhara, Yokosuka, both of Japan

[73] Assignee: Nissan Motor Company, Limited, Japan

[21] Appl. No.: 894,881

[22] Filed: Aug. 8, 1986

[30] Foreign Application Priority Data

| | | | |
|---|---|---|---|
| Aug. 9, 1985 | [JP] | Japan | 60-175274 |
| Aug. 9, 1985 | [JP] | Japan | 60-175275 |
| Aug. 9, 1985 | [JP] | Japan | 60-175276 |
| Aug. 9, 1985 | [JP] | Japan | 60-175277 |

[51] Int. Cl.[4] ............ G01S 1/24

[52] U.S. Cl. ............ 342/389; 342/390

[58] Field of Search ............ 342/388-391, 342/103; 364/452; 329/122, 123; 328/133

[56] References Cited

U.S. PATENT DOCUMENTS

| | | | |
|---|---|---|---|
| 3,706,092 | 12/1972 | Cox, Jr. et al. | 328/133 |
| 4,224,623 | 9/1980 | Mercer et al. | 342/390 |
| 4,255,740 | 3/1981 | Ferrie | 455/135 |
| 4,595,886 | 6/1986 | Mroch et al. | 331/1 A |
| 4,595,927 | 6/1986 | Menick | 342/309 |
| 4,601,061 | 7/1986 | Carney et al. | 329/122 |

FOREIGN PATENT DOCUMENTS

| | | | |
|---|---|---|---|
| 58-82167 | 5/1982 | Japan . | |
| 0129377 | 8/1983 | Japan | 342/103 |

*Primary Examiner*—Theodore M. Blum
*Assistant Examiner*—Gregory C. Issing
*Attorney, Agent, or Firm*—Lowe, Price, LeBlanc, Becker & Shur

[57] ABSTRACT

A Loran-C signal receiving apparatus which achieves accurate measurement of the location of the apparatus without error due to a well-known cycle slip phenomenon. In the Loran-C signal receiving apparatus, a pulse tracking a particular cycle of a carrier wave of the received Loran-C signal is generated, a frequency at which the tracking pulse is generated by a pulse generator (in a PLL circuitry) is monitored and when a frequency error of the generator is derived on the basis of a tracking error of the tracking pulse with respect to the received Loran-C signal, the frequency of the pulse generator is corrected on the basis of the derived frequency error. The apparatus can thus assure a phase tracking of the received Loran-C signal and assure accurate measurement of the location.

29 Claims, 15 Drawing Sheets

FIG. 3
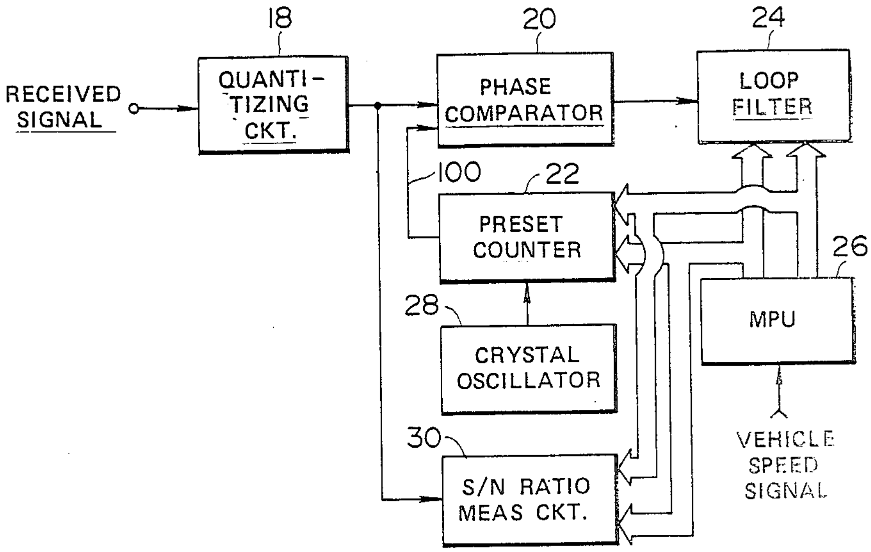
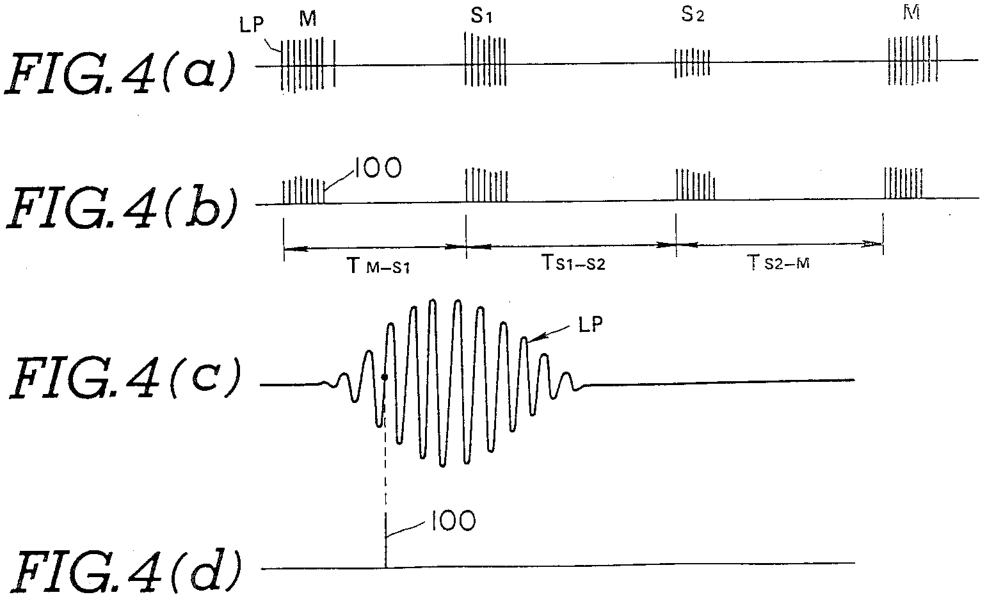
FIG. 4(a)
FIG. 4(b)
FIG. 4(c)
FIG. 4(d)

FIG. 5(a)
FIG. 5(b)
FIG. 5(c)
FIG. 5(d)
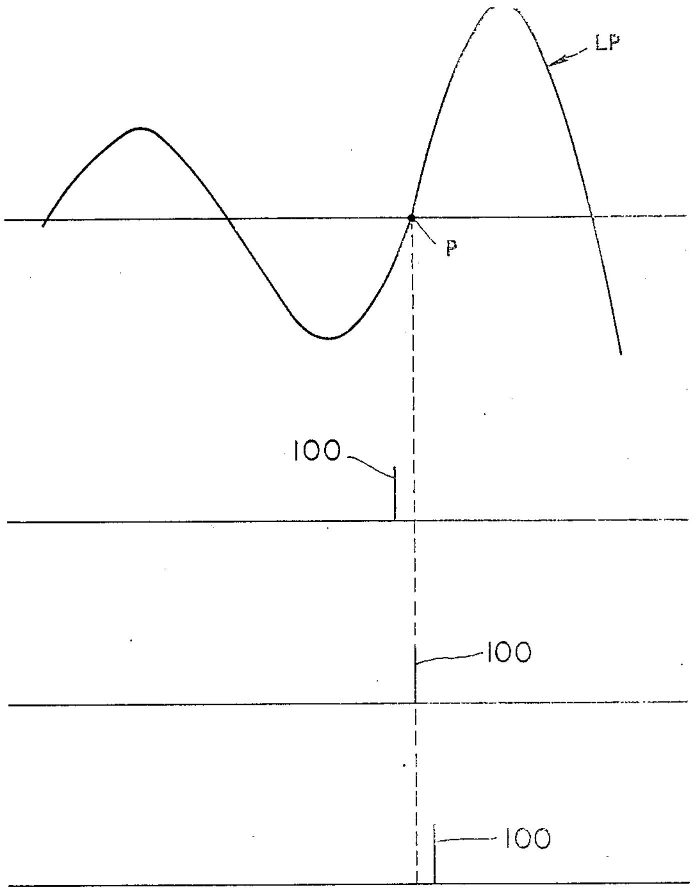
FIG. 7
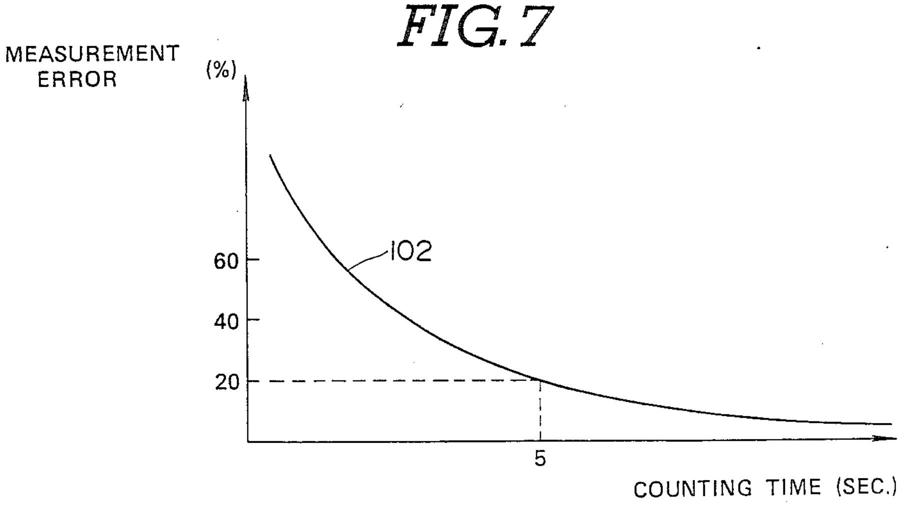

LORAN-C SIGNAL RECEIVING APPARATUS

BACKGROUND OF THE INVENTION

The present invention relates to an electromagnetic wave navigation system and more particularly to a Loran-C signal receiving apparatus used in a Loran-C navigation system, which employs hyperbolic electromagnetic navigation techniques.

A Loran (Long range navigation)-C system employs a chain comprising one master transmission station and two or more subsidiary transmission stations. The master transmission station transmits a group of nine Loran pulses. The other subsidiary transmission stations transmit groups of eight Loran pulses. Each transmission station generates the above-described Loran pulses at a pulse group repetition rate prescribed for each chain. In addition, each subsidiary transmission station generates its station Loran pulses with a coding delay with respect to the transmission pulse of the master transmission station distinct from that of other subsidiary transmission stations. Hence, in the Loran-C signal receiving apparatus, the difference in distance to each of the two fixed points represented by the master and each subsidiary transmission station can be derived from the delay in time between receipt of the secondary station pulses and of master station pulses so that the location of the Loran-C signal receiving apparatus can be identified by the intersection of the two Loran hyperbolics drawn for the two sets of two fixed points.

In the Loran-C receiving apparatus, the phase of a specified cycle of the carrier wave in each received pulse (generally, the third cycle of the carrier wave) is tracked by reference to a pulse generated within the receiving apparatus and synchronized with each received pulse in order to measure the reception delay time of the pulses from the secondary transmitting stations with respect to those from the master transmission station on the basis of the phase tracking point (i.e., third cycle of the carrier wave of each Loran pulse).

Conventionally, the above-described phase tracking has been carried out by the use of PLL (Phase-Locked Loop) circuitry, e.g., shown in FIG. 1.

The PLL circuitry shown in FIG. 1 (used for the phase tracking) is disclosed in a Japanese Utility Model Registration Unexamined Open No. Sho. 58-182167 filed on May 31, 1982.

In FIG. 1, a tracking pulse 100 derived from a frequency divider 10 is sent to a phase comparator 12 (comprising an Exclusive-OR gate) in which the phases of the tracking pulse 100 and the carrier wave of the Loran-C pulse are compared. An output signal indicative of the results of this comparison (comparison signal) is sent to a VCO 16 (Voltage Controlled Oscillator) 16 via a LPF 14 (Loop Filter). The oscillating output of the VCO 16 having a frequency adjusted according to the comparison signal is sent to the frequency divider 10 to close a loop.

If the amplitude of the received electrical signal is too low, phase comparison by the phase comparator 12 is impossible. As a result, the PLL circuitry shown in FIG. 1 works in a so-called free run state, the VCO 16 accumulates frequency errors and the comparison signal (i.e., tracking pulse 100) of the phase comparator 12 gradually deviates from the tracked carrier wave of the Loran-C pulse. Consequently, once the comparison signal inputted to the phase comparator 12 deviates at least one-half cycle from the tracked carrier wave of the Loran-C pulse, a so-called cycle slip phenomenon (deviation of the tracking point by one or more wavelengths of the carrier wave) occurs, which causes a large measurement error in the location.

To cope with this problem, a temperature-compensated crystal oscillator is used in the VCO 16.

However, since the frequency error of the above-described crystal oscillator is generally one ppm (parts per million) at the maximum and the carrier wave frequency of the Loran-C pulse has a frequency of 100 kilohertz (kHz), the cycle slip still occurs if the PLL circuitry runs free for five seconds or more.

Hence, if the received electrical signal should weaken, as sometimes occurs when the Loran-C signal receiving apparatus is used for measurement of the location of a moving object such as a vehicle, the cycle slip will inevitably occur and consequently large measurement errors in the location often result.

As described above, there is a problem in the conventional Loran-C signal receiving apparatus in that when the amplitude of the received (Loran-C) signal is too low, the PLL circuitry runs free, the frequency errors in the pulse tracking the received signal accumulate, and the cycle slip phenomenon consequently occurs so that accurate measurement of location cannot be achieved.

SUMMARY OF THE INVENTION

With the above described problem in mind, it is a general object of the present invention to provide an improved Loran-C signal receiving apparatus.

It is another object of the present invention to provide a Loran-C signal receiving apparatus which can continuously measure the location of the apparatus without significant error even though the amplitude of the received Loran-C signal is greatly reduced.

It is a further object of the present invention to provide a Loran-C signal receiving apparatus which can enhance the frequency accuracy of a pulse tracking the received Loran-C signal.

It is a still another object of the present invention to provide a Loran-C signal receiving apparatus which can prevent large measurement errors of location of the apparatus due to cycle slip.

It is a still another object of the present invention to provide an improved Loran-C apparatus as described above applicable to a moving object such as a vehicle.

The above-described objects can be achieved by providing an apparatus comprising: (a) first means for generating a frequency signal and outputting a pulse tracking a particular cycle of a received signal; (b) second means for monitoring the frequency of the first means and deriving the frequency error thereof with respect to the received signal on the basis of the tracking error of the tracking pulse; and (c) third means for correcting the frequency of the first means on the basis of the frequency error derived by the second means.

In a first preferred embodiment, the second means preferably derives and stores the frequency error from a tracking error of the pulse which tracks the received signal from a transmission station with the highest signal-to-noise (S/N) ratio and the third means corrects the frequency using the accumulated frequency error.

In a second preferred embodiment, fourth means for detecting the signal-to-noise (S/N) ratio of the received signal is also provided, the tracking pulse tracks the received signal with the highest signal-to-noise ratio among those received signals from signal transmission stations, the second means accumulates the derived frequency error values over a given length of time, and the third means corrects the frequency using the frequency errors accumulated by the second means.

In a third preferred embodiment, the second means comprises: (a) fifth means for comparing a phases of the received signal with that of the tracking pulse to detect whether the tracking error of the tracking pulse is in an allowable range; (b) sixth means for deriving the frequency error from the detecting tracking error; and (c) seventh means for accumulating the frequency error and the third means corrects the frequency of the first means according to the accumulated frequency error when the tracking error is within the allowable range.

In a fourth preferred embodiment, eight means for deriving an interval at which the frequency is corrected on the basis of the frequency error derived by the second means is further provided so that the third means corrects the frequency of the first means according to the frequency error derived by the second means at the interval derived by the eighth means.

BRIEF DESCRIPTION OF THE DRAWINGS

A more complete understanding of the present invention may be obtained from the following detailed description taken in conjunction with the attached drawings in which:

FIG. 3 is a circuit block diagram of the preferred embodiments of the Loran-C signal receiving apparatus according to the present invention;

FIGS. 4(*a*) through 4(*d*) are signal timing charts for explaining the phase tracking operation and the delay in time between receipt of two subsidiary transmission station pulses and of master transmission station pulses;

FIGS. 5(*a*) through 5(*d*) are signal timing charts for explaining the frequency error detection function of the tracking pulse;

FIG. 7 is a graph of counting time versus measurement error;

DETAILED DESCRIPTION OF THE PREFERRED EMBODIMENT

Reference will hereinafter be made to the drawings in order to facilitate understanding of the present invention.

Figure 1:
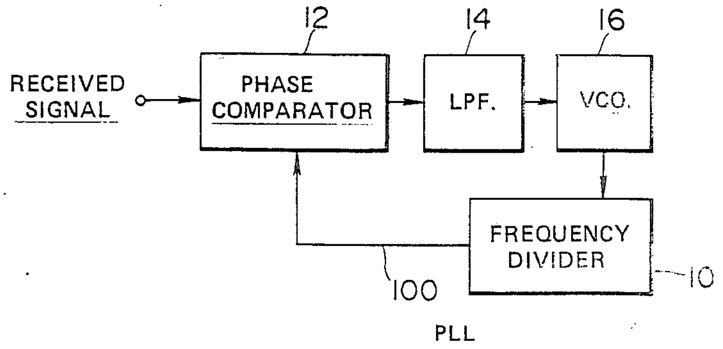
FIG. 1 shows the PLL circuitry used for tracking the phase of the particular cycle of the Loran-C pulse carrier wave in the conventional Loran-C signal receiving apparatus.

FIG. 1 has been discussed above.

Figure 2:
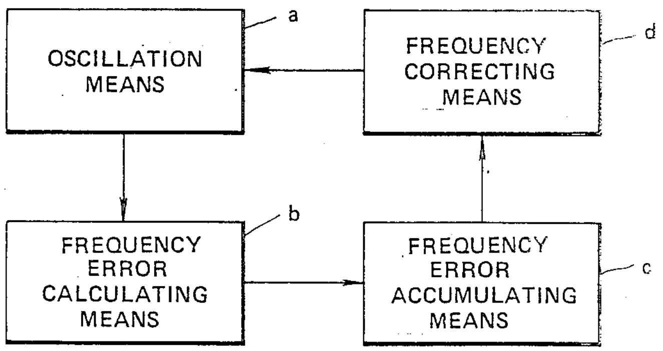
FIGS. 2(*a*) through 2(*d*) are functional block diagrams for explaining the general concepts of first through fourth preferred embodiments of the Loran-C signal receiving apparatus according to the present invention.
Figure 2:
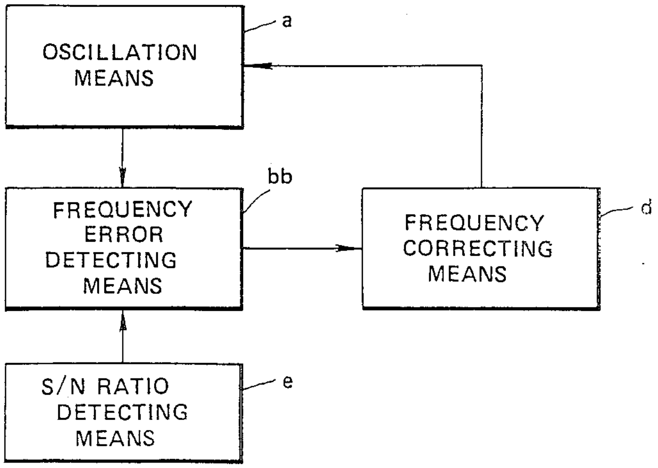
Figure 2:
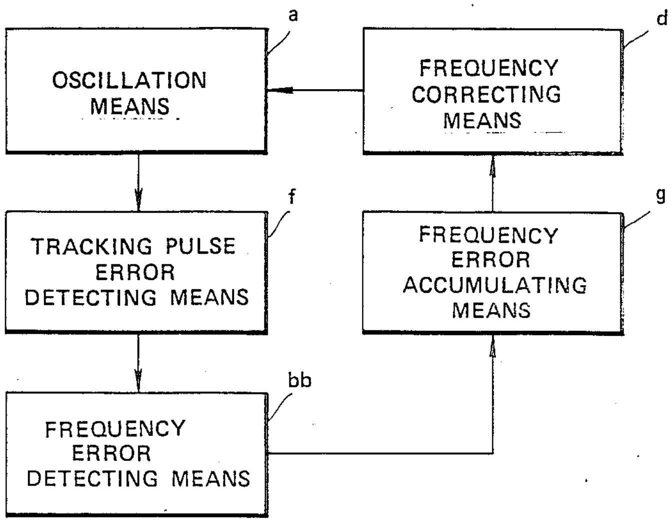
Figure 2:
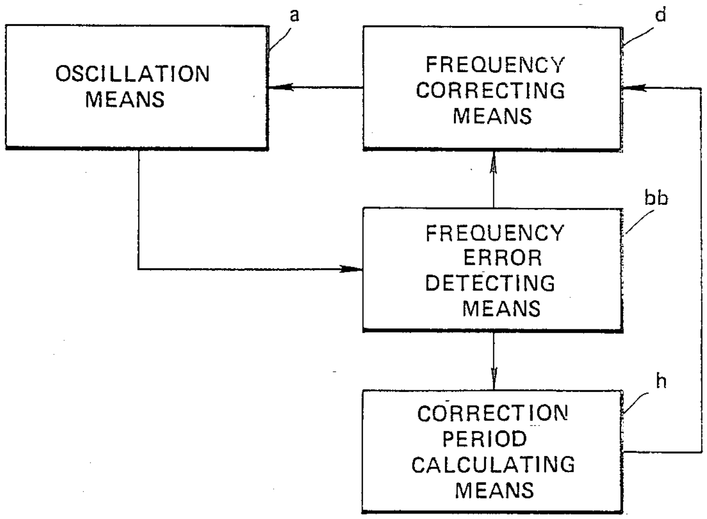

FIGS. 2(*a*) through 2(*d*) are functional block diagrams which may help explain the general concepts of the first, second, third, and fourth preferred embodiments of the present invention.

FIRST PREFERRED EMBODIMENT

FIG. 2(*a*) diagrammatically shows the general concepts of the first preferred embodiment.

In FIG. 2(*a*), frequency means "a" generates a pulse tracking a received signal (specifically, a particular zero-crossing point of a third cycle of the carrier wave of each Loran-C pulse). Frequency error calculating means "b" derives the frequency error of the frequency means "a" from a tracking error (deviation of the tracking pulse from the particular zero-crossing point) of the tracking pulse generated by the frequency means "a". In addition, the frequency error is stored in frequency error accumulating means "c" and frequency correcting means "d" corrects the frequency error of the frequency means a using the stored frequency error.

FIG. 3 shows a specific circuit configuration of a main part of the Loran-C signal receiving apparatus.

In FIG. 3, a quantitizing circuit 18 continuously receives a signal, i.e., Loran-C pulses LP shown in FIG. 4(*a*) from three transmission stations. In FIG. 4(*a*), a master transmission station signal M, a first subsidiary transmission station signal $S_1$, and a second subsidiary transmission station signal $S_2$, each constituting a Loran-C signal, are sequentially transmitted at predetermined intervals.

Each of these master transmission station signal M and subsidiary station transmission signals $S_1$ and $S_2$ comprises a train of Loran-C pulses LP separated by intervals of one millisecond. FIG. 4(*c*) shows an enlarged Loran-C pulse LP.

The quantitizing circuit 18 shown in FIG. 3 quantitizes the above-described received signal into a two-value form (binary form) and the phase of the binary data is compared with that of the tracking pulse 100 derived from a preset counter 22 to be described later. The output signal of the phase comparator 20 is then sent to the loop filter 24, in which it is averaged.

It is noted that a control constant of the loop filter 24 may be controlled to an appropriate value according to the S/N (Signal-to-Noise) ratio of the received signal. The construction of the loop filter (LPF) 24 and selection of the control constant are disclosed in a U.S. patent application Ser. No. 733,052 filed on May 9, 1985 (which corresponds to a Japanese Patent Application Unexamined Open No. Sho 60-237380). The contents of the above-identified U.S. Patent Application are hereby incorporated by reference.

The loop filter 24 provides a pulse commanding the preset counter 22 to increment or decrement a present value thereof (corresponding to the tracking error (phase advance or phase retard)) in response to the output signal of the phase comparator 20. The preset value of the preset counter 22 is then incremented or decremented one-by-one in accordance with an output pulse derived by an MPU 26 (MicroProcessor Unit). The preset counter 22 counts down the frequency pulses from a crystal oscillator 28 until the counted value reaches zero and produces the above-described tracking pulse 100.

Each tracking pulse 100 is thus synchronized with the corresponding Loran pulse LP. Consequently, as appreciated from FIGS. 4(*c*) and 4(*d*), the tracking pulse 100 is held in phase with the zero-crossing point of the third cycle of the carrier wave constituting the individual Loran pulse LP.

As appreciated from FIG. 4(*b*), tracking pulses 100 are derived for the respective Loran pulses LP.

After the tracking pulses 100 have been derived in the way described above, time delays $T_{M\text{-}S1}$, $T_{S1\text{-}S2}$, and $T_{S2\text{-}M}$ between receipt of the master transmission station signal M and of the first subsidiary station signal $S_1$, *and of the second subsidiary station signal* $S_2$ can be measured. Therefore, the measurement of the present location of, e.g. the travelling vehicle (in which the apparatus is mounted) can be carried out using the measured time delays.

It should be noted that the frequency of the carrier wave of the Loran-C pulse LP is extremely accurate and, therefore, in the first preferred embodiment, the frequency of the tracking pulse 100 is corrected as described below.

Due to frequency errors in the crystal oscillator 28 itself, the tracking pulse 100 may deviate from the nominal tracking point P in FIG. 5(*a*) forward (phase advance) as shown in FIG. 5(*b*) or rearward as shown in FIG. 5(*d*). However, the tracking pulse 100 is eventually brought into coincidence with the nominal tracking point P by means of the PLL circuitry, i.e. the loop filter 24, as shown in FIG. 5(*c*).

Therefore, the frequency error of the crystal oscillator 28, in other words, the phase tracking error of the tracking pulse 100 can be detected from the above-described output pulse of the LPF 24 representing a command to increment or decrement the preset value of the preset counter 22.

In the first preferred embodiment, the MPU 26 measures the above-described frequency error and corrects the frequency of the tracking pulse 100. In order to execute the above-described detection and correction processing, the MPU 26 receives a signal indicative of the S/N ratio from an S/N ratio measurement circuit 30 and a vehicle speed signal from a vehicle speed sensor (not shown). The S/N ratio measurement circuit 30 statistically measures the S/N ratio of the received signal.

The detailed construction of the S/N ratio measurement circuit 30 is disclosed in a U.S. patent application Ser. No. 617,938 filed on June 6, 1984 (which corresponds to a Japanese Patent Application Unexamined Open No. Sho 59-230171). The contents of the above-identified U.S. Patent Application are hereby incorporated by reference.

The S/N ratio measurement circuit 30 is capable of deriving a probable S/N ratio value by sampling the binary data from the quantitizing circuit 18.

Figure 6:
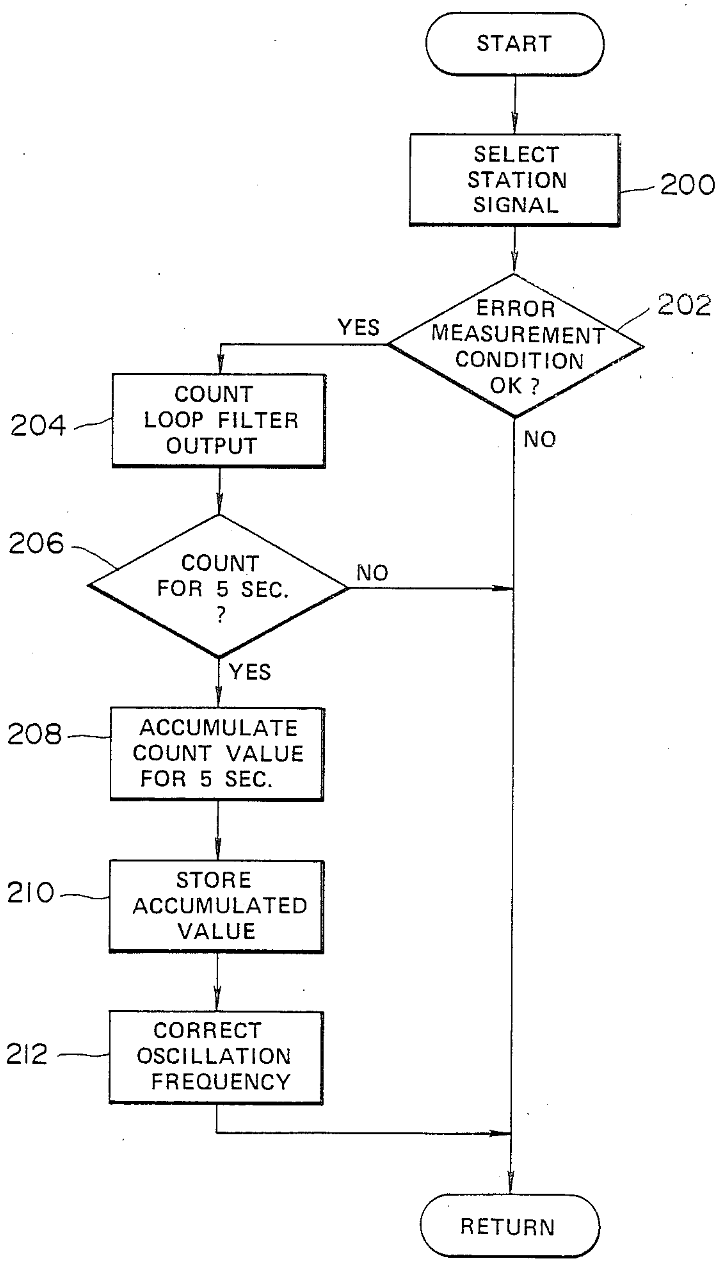
FIG. 6 is a processing flowchart employed in the first and second preferred embodiments.

FIG. 6 shows a processing routine for detecting and correcting the frequency error of the tracking pulse 100 in the first preferred embodiment.

In a first step 200 of FIG. 6, the MPU 26 selects the transmission station with the highest S/N ratio based on the signals from the S/N ratio measurement circuit 30.

In a step 202, the MPU 26 determines whether an error measurement condition is satisfied, i.e., determines whether it is possible to use the received signal from the selected station as a criterion for the detection of the frequency error of the tracking pulse 100. In this embodiment, the MPU 26 determines that the received signal from the selected station can be used as the detection criterion for the frequency error of the tracking pulse 100 when both the S/N ratio of the selected station signal is satisfactorily high and the speed of the vehicle in which the Loran-C signal receiving apparatus is mounted satisfies a predetermined vehicle speed condition. When both conditions are satisfied in the step 202, the MPU 26 starts counting the number of pulses in the output signal of the loop filter 24 in a step 204.

A step 206 ensures that the counting operation continue for five seconds. After five seconds have elapsed since the start of the counting operation, the current count value is added to the value obtained in the last counting operation. Consequently, the count values over each five second period lapse are sequentially accumulated for each five second lapse in a step 208. In the next step 210, the accumulated value is stored, preferably in a memory or register of the MPU 26.

Upon storing the accumulated value in the memory, the routine goes to a step 212 in which the preset value of the preset counter 22 is controlled in accordance with the accumulated value and the frequency of the tracking pulse 100 is thereby corrected.

It should be noted that the preset value control carried out in the step 212 is independent of the preset value control for the phase tracking. That is to say, the preset counter 22 produces tracking pulses for tracking the received Loran-C signal. In detail, the preset counter 22 produces tracking pulses for the down pulses received from the first subsidiary transmission station $S_1$ by dividing the clock signal derived from the crystal oscillator 28 according to the time difference of receipts between the corresponding Loran-C pulses of the master and first subsidiary transmission station M and $S_1$ after producing the tracking pulses for the Loran-C pulses of the master station M. For example, if the above-described time difference is 35 milliseconds and clock signal frequency is 10 MHz (period of 0.1 millisecond), the preset counter 22 is controlled to divide the clock signal by 350,000 (35 msec./0.1 microsecond), to produce the tracking pulses for the first subsidiary transmission station $S_1$. In addition, although the time difference described above is changed due to the travel of the vehicle, the PLL circuitry including the phase comparator 20 and loop filter 24 detects the changed time difference and adjusts the above-described ratio of division P and the preset counter 22 serves to carry out the frequency division of the clock signal derived from the crystal oscillator 28. Therefore, the preset value control for the phase tracking indicates the adjustment of the frequency division ratio P by means of the above-described PLL circuitry.

On the other hand, the correction of the frequency error in the clock signal is carried out once for each predetermined period (five seconds) by the adjustment of the frequency division ratio P of the preset counter 22.

In this embodiment, the Loran-C signal with the highest S/N ratio is selected and the output pulse of the loop filter 24 for the selected Loran-C signal is used to measure the frequency error of the tracking pulse 100. However, pulses may erroneously be outputted by the loop filter 24 due to noise in the received signal.

Frequency error of the tracking pulse can be measured with high resolution by averaging the counted output pulse number from the loop filter 24 over the counting interval.

It should be noted that if the counting interval is set arbitrarily long, cycle slip will probably occur during the set counting time. Therefore, the counting of the number of pulses from the loop filter 24 must be carried out in units of five seconds, when the measurement accuracy of the location is taken into consideration.

FIG. 7 is a graph of counting time versus measurement error. As appreciated from FIG. 7, the measurement error can be reduced to approximately 20 percent by counting the output pulses of the loop filter 24 over five-second intervals. Consequently, the MPU 26 can measure the the frequency error with enough resolution to correct the frequency of the tracking pulse 100.

If N pulses are produced by the loop filter 24 over five seconds and the tracking pulse 100 is controlled to shift forward or rearward by 0.1 microseconds in response to the received signal, the frequency error E of the tracking pulse 100 can be expressed as follows:

$$E = \frac{N \times 0.1}{5} \text{ (ppm)} \quad (1)$$

Thus, if the count value over five seconds is 40, the measured frequency error E will be 0.8 ppm ($=40\times0.1\div5$). If the preset value of the preset counter 22 is controlled using the measured frequency error value (0.8 ppm), the frequency of the tracking pulse 100 is then corrected. The actual procedure for frequency correction of the tracking pulse 100 is to be described in the fourth preferred embodiment. Consequently, phase tracking is possible even when the S/N ratio of the received signal drops to near minus twenty decibels (−20 dB) at the initial stage of processing.

After the output pulses of the loop filter 24 are counted over the next five seconds and count value is e.g., five, the frequency error E will be come 0.9 ppm ($=(40+5)\times0.1\div5$). The value of the preset counter 22 is controlled so as to cancel the current frequency error E (=0.9 ppm).

In the way described above, after each five-second period over which the output pulses of the loop filter 24 are counted, the frequency error E is calculated using equation (1) and using the accumulated number of pulses from the loop filter 24. The preset value of the preset counter 22 is then adjusted to correct for the error value E. Finally, accurate phase tracking of the specified cycle of the carrier wave of the Loran-C signal can be ensured even when the S/N ratio of the received signal is reduced to −20 dB or less. Hence, accurate measurement of location can without occurrence of cycle slip can always be performed.

SECOND PREFERRED EMBODIMENT

FIG. 2(*b*) shows the general concepts of the second preferred embodiment.

In FIG. 2(*b*), the frequency means a generates a pulse tracking the received signal.

The signal-to-noise ratio of the received signal is detected by S/N ratio detecting means "e". When the signal-to-noise ratio of the received signal exceeds a predetermined value, the frequency error of the frequency means "a" is derived by frequency error detecting means "bb" from the tracking error of the tracking pulse with respect to the received signal.

The frequency of the frequency means "a" is corrected by the frequency error correcting means "d".

The specific circuit construction and operation of the second preferred embodiment have already been described in the first preferred embodiment with reference to FIGS. 3 through 6.

Therefore, only the effect of the second preferred embodiment will be described in detail below.

A unit control amount M for shifting the tracking pulse frequency forward and rearward according to the polarity of output pulses from the loop filter 24 is determined by the ratio (n/f) of the amount of increment or decrement of the preset counter 22 to the frequency f of the crystal oscillator 28. As the above-described unit control amount M increases, the tracking error increases and the accuracy of measurement of the location is thus reduced.

Since a measurement error of 200 to 300 meters is usually allowable under favorable signal reception conditions when the Loran-C signal receiving apparatus is being used to locate a moving vehicle, with the accuracy of measurement having an allowance range of about 100 meters, the unit control amount M for shifting the tracking pulse frequency forward (increment direction) and rearward (decrement direction) at that case is set to 0.4 microseconds (substantially corresponds to a measurement error of 120 meters).

The tracking pulse 100 is advanced or delayed by 0.4 microseconds in accordance with output pulses of the loop filter 24. Thus, the location of the vehicle can be measured with high accuracy.

The number of times the cycle slip occurs tends to increase as the S/N ratio of the received signal drops. Thus the unit control amount M for controlling the frequency increase or decrease of the tracking pulse 100 is set to a smaller value, as the S/N ratio drops, so that the frequency of the tracking pulse 100 is corrected with a unit control amount through the processing routine shown in FIG. 6 so as to achieve the optimum frequency of the tracking pulse 100 with high accuracy.

When the location of a moving vehicle is being measured, it is necessary to prevent the occurrence of cycle slip phenomenon, since the received signal often completely disappears for periods on the order of ten seonds when e.g. the vehicle travels through a tunnel. The frequency error of the tracking pulse 100 must remain within five microseconds of optimal for ten seconds, i.e., within 0.5 ppm.

To generate a tracking pulse 100 with a frequency error of no more than 0.5 ppm, the frequency error itself must be measured to within 0.1 ppm. In this embodiment, the frequency error count (output pulses from the loop filter 24) is totalled over successive intervals of time so that when the accumulated value is averaged over the predetermined interval of time, the detection error of the frequency error is minimized.

If the accumulation time of the frequency error is unlimitedly long, the S/N ratio of the received signal is sure to drop sometime during the accumulation period before the frequency is corrected and the cycle slip will occur.

Therefore, if the unit control amount M of the tracking pulse 100 is set to 0.4 microseconds, the frequency error of the tracking pulse 100 needs to be accumulated over an interval of about four seconds.

Since the frequency error (output pulse count of the loop filter 24) of the tracking pulse 100 in the processing routine of FIG. 6 is counted for no more than four seconds in this embodiment, the high-resolution averaged frequency error is used to correct the frequency of the tracking pulse 100.

To carry out high-resolution measurement of frequency error, the S/N ratio of the received signal needs to be high enough to prevent the loop filter 24 from operating erroneously due to noise.

Figure 8:
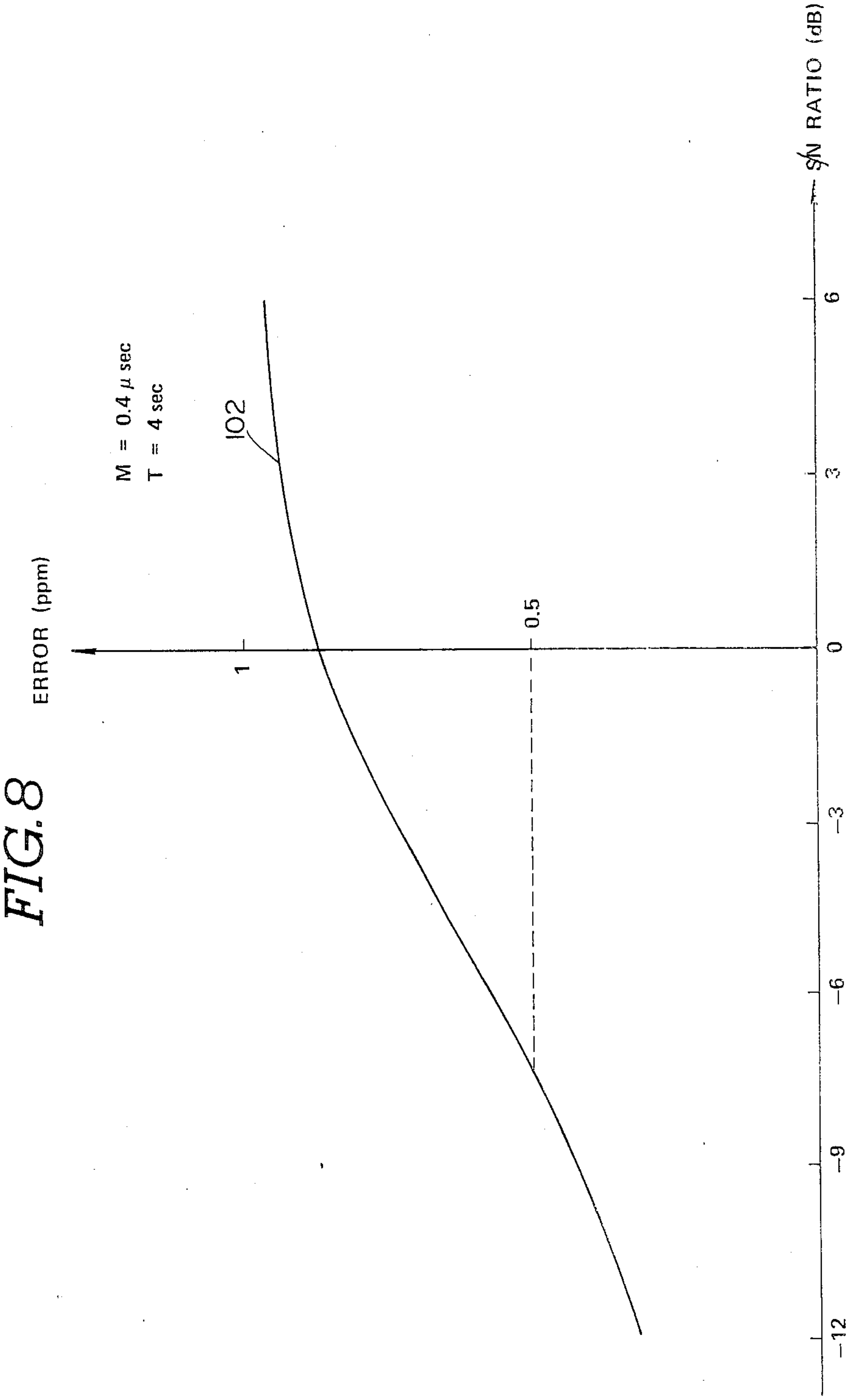
FIG. 8 is a simulated graph of detection error of the frequency error with respect to the S/N (Signal-to-Noise) ratio of the received signal.

FIG. 8 is a characteristic graph of the relationship 102 between the frequency error of the tracing pulse 100 and the S/N ratio of the received signal. The characteristic graph 102 shown in FIG. 8 was obtained through simulation. In FIG. 7, the frequency error of the crystal oscillator 28 is assumed to be 1 ppm, the unit control amount M of the tracking pulse 100 is 0.4 microseconds, the output pulse count time T of the loop filter 24 is four seconds.

As appreciated from the characteristic graph 102 of FIG. 8, the frequency error will be 0.5 ppm when the S/N ratio of the received signal falls between −8 and −7 decibels (dB). Accordingly, in this embodiment, the frequency error of the tracking pulse 100 is measured when the S/N ratio of the received signal from the selected station is equal to or greater than minus six decibels (−6 dB).

As described hereinabove, since, in this embodiment, the unit control amount M of the tracking pulse 100 is equal to or less than 0.4 microseconds and the frequency error accumulation time is four seconds, the resolution of the frequency error can be held to about 0.1 ppm. Furthermore, since frequency error is measured in order to correct the frequency when the S/N ratio of the received signal from the selected station is equal to or greater than six decibels (−6 dB), cycle slip will not occur even when the vehicle travels through a region in which signal intensity is lost, such as in tunnels. Therefore, it is possible to highly accurately measure the location of a travelling receiver without large error.

THIRD PREFERRED EMBODIMENT

FIG. 2(*c*) shows the general concepts of the third preferred embodiment.

In FIG. 2(*c*), the frequency means a generates the pulse tracking the signal received by the Loran-C signal receiving apparatus and tracking pulse error detecting means f measures the tracking error of the tracking pulse generated by the frequency means a with respect to the received signal. In addition, the frequency error of the frequency means a is detected by means of frequency error detecting means bb from the tracking error of the tracking pulse and the detected frequency error is then accumulated in frequency error accumulating means g.

Furthermore, when the tracking error of the tracking pulse falls within an allowable range, the frequency error accumulated in the frequency error accumulating means g is used in the frequency correcting means d to correct the frequency of frequency means a.

The specific circuit construction of the third preferred embodiment is substantially the same as that of the first (or second) preferred embodiment shown in FIG. 3. It should, however, be noted that although the MPU 26 measures the frequency error and corrects the frequency of the tracking pulse 100 using the detection signal of the S/N ratio measurement circuit 30, the vehicle speed detection signal from the vehicle speed sensor is not always needed in the third preferred embodiment.

In addition, since the processing routine which the MPU 26 executes is slightly different from that in the first preferred embodiment, this processing routine will be described below with reference to FIG. 9. As shown in the processing flowchart of FIG. 9, the difference from that of FIG. 6 is an additional step 203 following step 202.

In this embodiment, the MPU 26 determines in the step 202 whether it is possible to use the received signal from the selected station as the detection criterion for the frequency error of the tracking pulse 100, i.e. if S/N ratio of the selected station is satisfactorily high, and if so, it determines in the step 203 whether the frequency error (tracking error) of the tracking pulse 100 exceeds an allowable range.

If the frequency error (tracking error) of the tracking pulse 100 is out of the allowable range in the step 203, the steps from 200 through 203 are merely repeated. Once the MPU 26 determines that the frequency error (tracking error) of the tracking pulse is within the allowable range, the MPU starts counting the number of pulses from the loop filter 24 in the step 204. The subsequent steps 205 through 212 are the same as in FIG. 6.

Next, the effect of this embodiment will be described in detail.

Assuming the number N of pulses are outputted by the loop filter 24 over a period of five seconds and the tracking pulse 100 is advanced or retarded in units of 0.2 microseconds (in other words, the frequency of the tracking pulse 100 is increased or decreased in units of 5 MHz) on the basis of the number N of pulses from the loop filter 24, the frequency error E of the crystal oscillator 28 can be calculated as follows:

$$E = \frac{N \times 0.2}{5} \text{ (ppm)} \quad (1)'$$

The preset value of the preset counter 22 is controlled by means of the MPU 26 so as to cancel the frequency error E calculated in the equation (1)'. The above-described control procedure is carried out separately from the control procedure of the preset value for the phase tracking as described in the first preferred embodiment.

Figure 10:
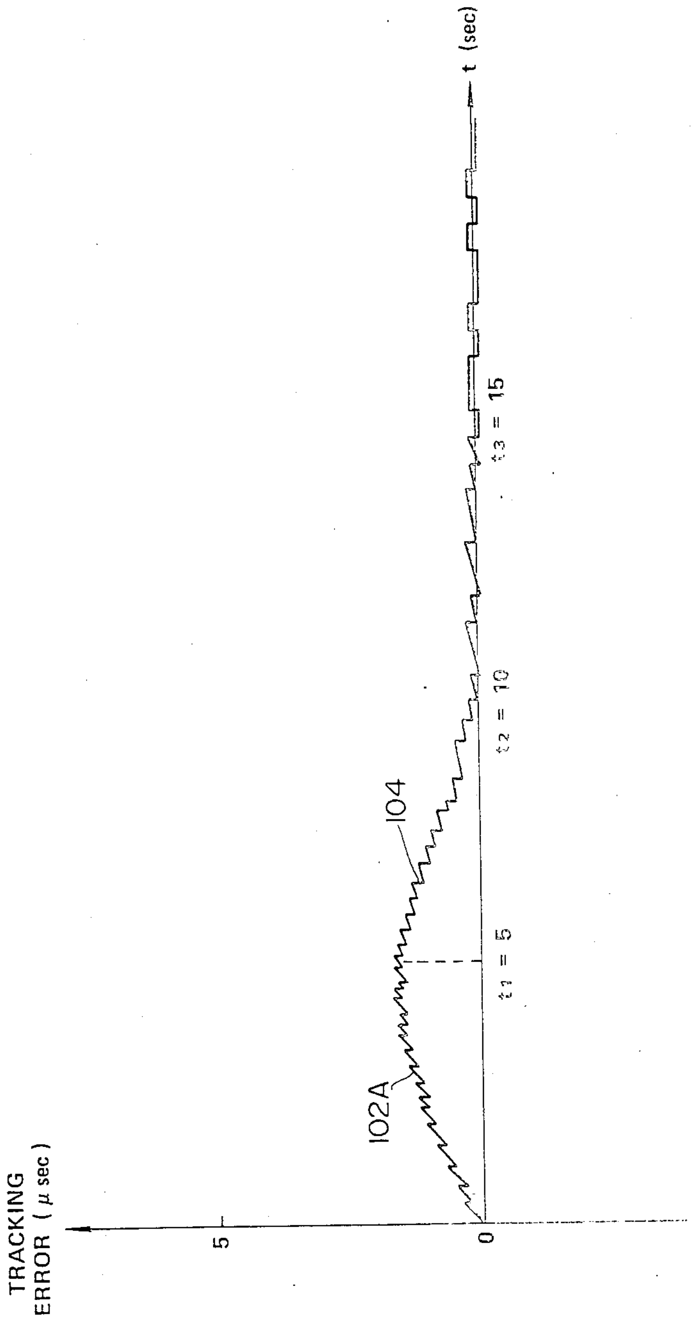
FIG. 10 is a graph for explaining a tracking error correction operation.

FIG. 10 is a characteristic graph of the tracking error with respect to time.

Figure 9:
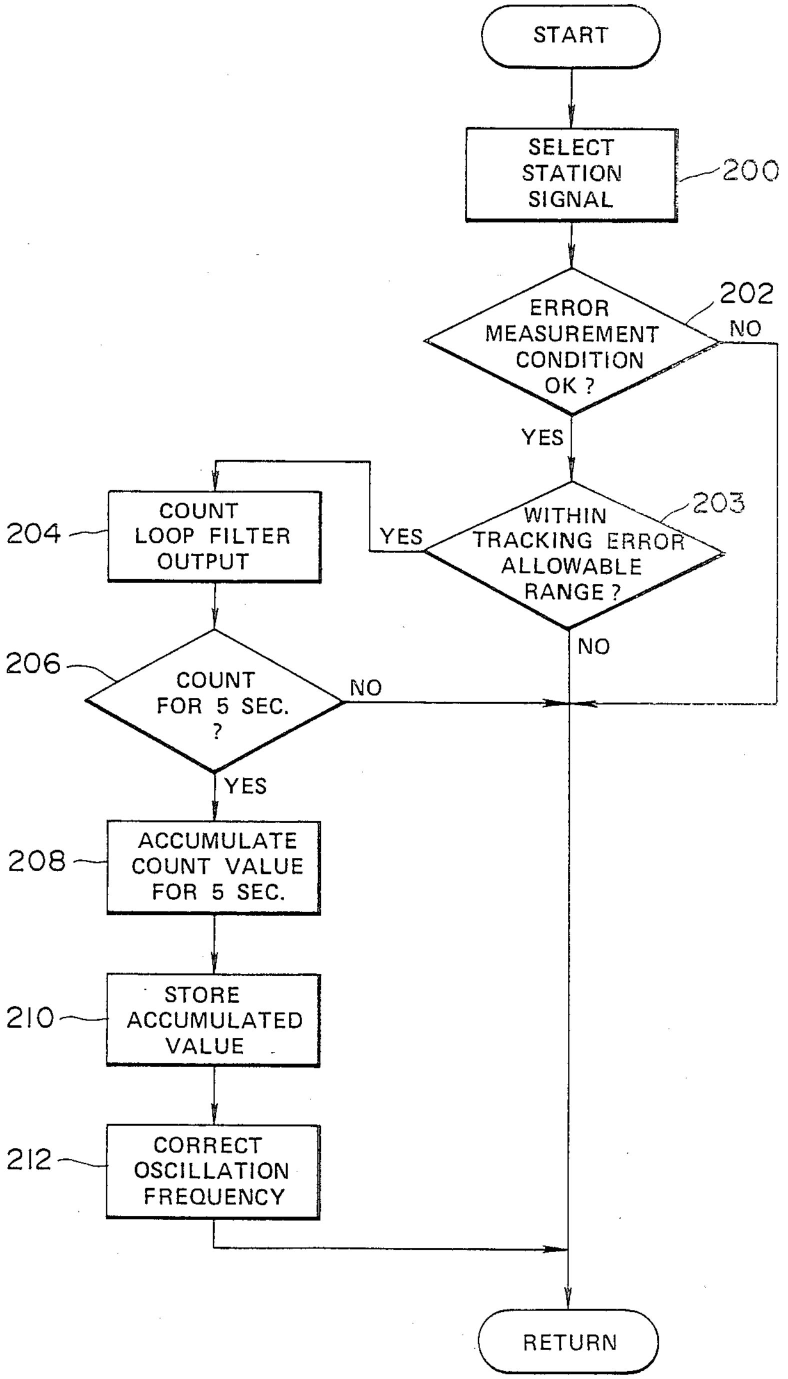
FIG. 9 is another processing flowchart employed in the third preferred embodiment.

The processing routine shown in FIG. 9 is assumed to start at the time t=0. The tracking error gradually increases from the start of the above-described processing routine in accordance with a characteristic curve denoted "102A".

The number of pulses N outputted by the loop filter 24 are counted in the MPU 26 during that time period. If the counted value N of the number of pulses outputted by the loop filter 24 after five seconds have elapsed is, e.g., plus 20 (+20), the frequency error E would be 0.8 (=20×0.2÷5) ppm. Thus, the preset value of the preset counter 22 is controlled so as to cancel the frequency error E (=0.8 ppm).

Hence, after time $t_1$, i.e. five seconds after time t=0, the frequency error is given as 0.2 (=1-0.8) ppm, due to the upper limit of correction resulting from the first iteration of equation (1)', and therefor the frequency error becomes much smaller than the frequency error (one ppm) of the crystal oscillator 28 itself.

Thereafter, after the preset value is used to cancel the slight frequency error of 0.2 ppm in addition to the normal preset value control for the phase tracking, the count value of the number of pulses derived from the loop filter 24 during five seconds from the time $t_1$ to the time $t_2$ might be, e.g., plus ten (+10) and the frequency error E would be 1.2 (=(20+10)×0.2÷5) ppm.

That is to say, if the frequency error is solely totalled over successive periods of five seconds, an excessive correction would be carried out on the previous slight frequency error E (=0.2 ppm) prior to the time $t_1$ and the magnitude of the frequency error E would thereby be increased.

To cope with this tendency toward excessive correction, when the above-described excessive correction is expected (i.e., negative acknowledgement in the step 203), the measurement of frequency error E is inhibited for five seconds. Therefore, the preset value control is carried out solely on the basis of the frequency error measured prior to time $t_1$ in FIG. 10 so that the tracking error is decreased as denoted by the characteristic curve 104.

Then, after a lapse of five seconds (time $t_2$), the measurement of the frequency error continues and the count value N of the number of pulses outputted by the loop filter 24 will, e.g. be plus four (+4) at a time $t_3$, fifteen seconds after to.

Hence, the frequency error E at that time ($t_3$) will be 0.96 (=(20+4)×0.2÷5) ppm and the preset value of the preset counter 22 is controlled by means of the MPU 26 so as to cancel the measured frequency error E (=0.96 ppm).

The frequency error is similarly accumulated after the time $t_3$. The count value N of the number of pulses outputted by the loop filter 24 may be about +1 after 20 seconds ($t_4$). The frequency error E at the time would be exactly ((20+4+1)×0.2÷5) ppm.

The actual procedure of the frequency error correction is to be described in the fourth preferred embodiment. As described above, in the third preferred embodiment, the frequency error of the tracking pulse 100 is detected on the basis of the received signal and the preset value of the preset counter 22 is controlled on the basis of the accumulated frequency error so as to cancel the frequency error of the crystal oscillator 28. Therefore, the occurrence of cycle slip due to the amplitude reduction of the received signal can effectively be avoided and thus the accurate measurement can continuously be made without large error of measurement of the point of location.

Consquently, an oscillator having a relatively low frequency accuracy can also be used and hence the cost of the Loran-C signal receiving apparatus can accordingly be reduced.

In addition, since, in the third preferred embodiment, the frequency error detection value is ignored when excessive correction of the frequency frequency is expected, the accurate location is always possible.

FOURTH PREFERRED EMBODIMENT

FIG. 2(*d*) shows the general concepts of the fourth preferred embodiment.

In FIG. 2(*d*), the frequency means a generates the tracking pulse which tracks the received signal. The frequency error of the frequency means a is derived from the tracking error of the tracking pulse. A short period over which incremental corrections to the frequency of the frequency means a are made is calculated on the basis of the frequency error of the frequency means a by correction period calculating means h. Then, the frequency of the frequency means a is corrected according to the frequency error period calculated by the correction period calculating means h.

The specific circuit construction of the fourth preferred embodiment is exactly the same as in the first preferred embodiment shown in FIG. 3.

In addition, the general processing routine is the same as in the first preferred embodiment shown in FIG. 6. However, the distinctive feature of the fourth preferred embodiment lies in the step 212, and so a detailed processing flowchart for step 212 is given in FIGS. 11 and 12, which will be described below in detail.

Figure 11A:
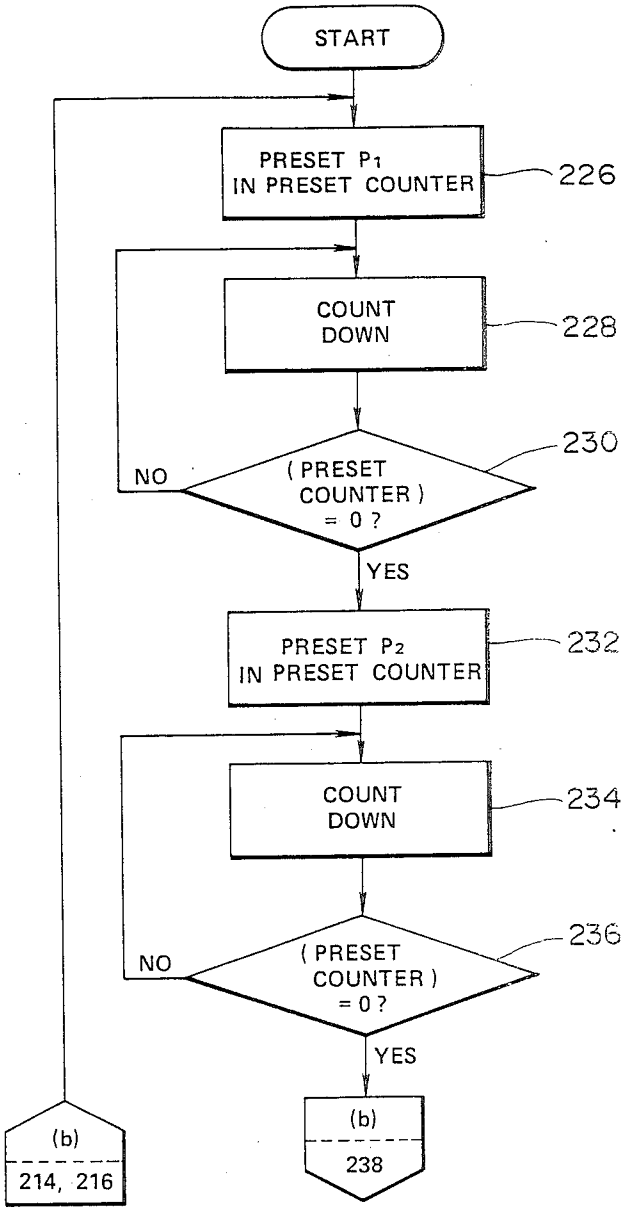
FIGS. 11(*a*) and 11(*b*) together form another processing flowchart employed in the fourth preferred embodiment.
Figure 11B:
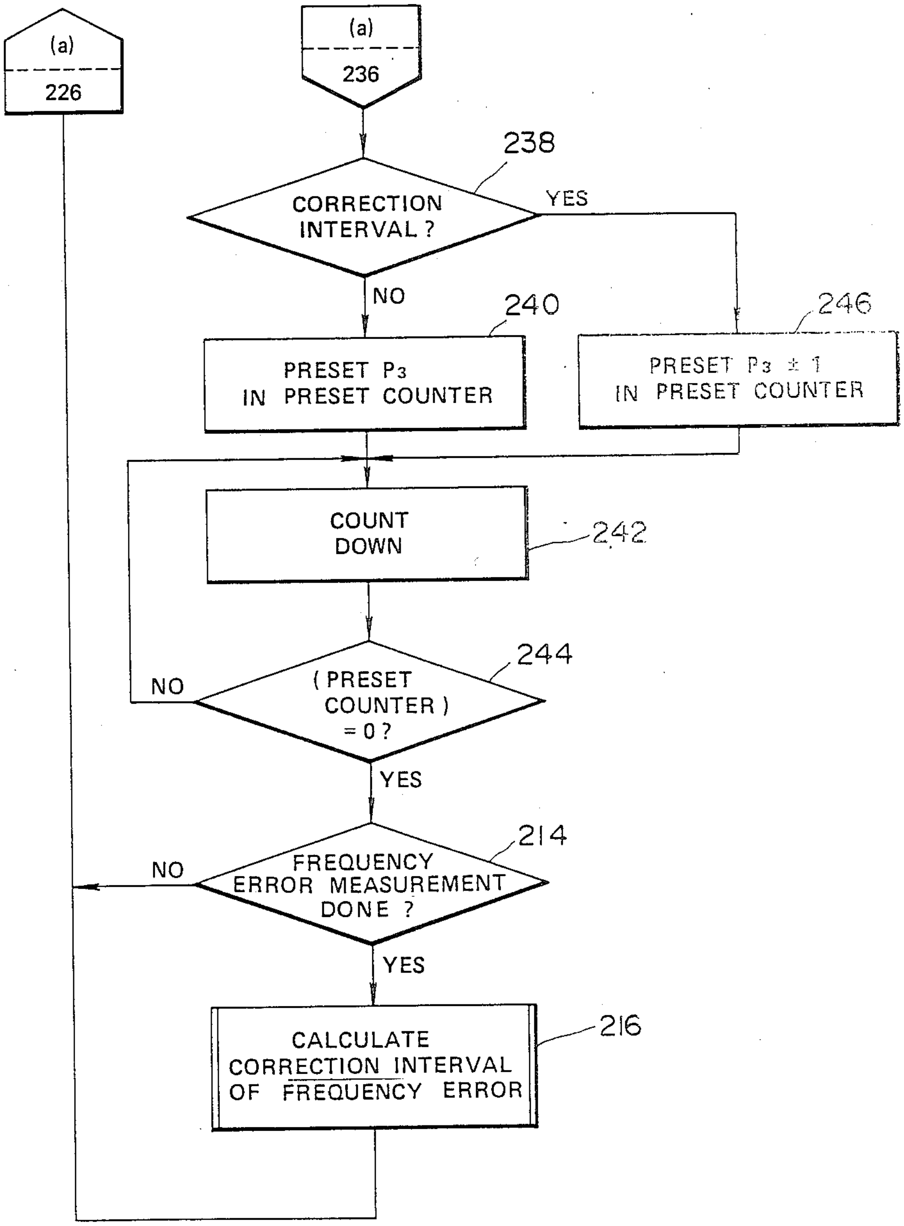

In a step 214 of FIG. 11(*b*), the MPU 26 determines whether the frequency error measurement (steps 204 through 210 of FIG. 6) has been completed. If so, the correction period calculation shown in FIG. 12 (step 216 in FIG. 11(*b*)) is started.

Figure 12:
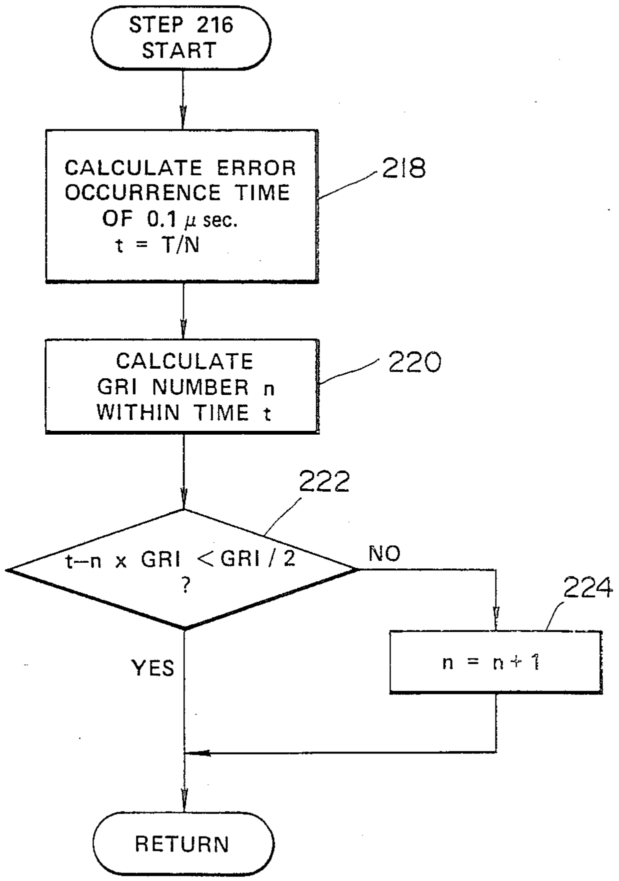
FIG. 12 is a still another processing flowchart in a step 216 of FIG. 11(*b*) on which the MPU 26 is executed.

In the step 216, the MPU 26 first divides the count time T (five seconds) by the count value N of the number of pulses derived from the loop filter 24 accumulated over five seconds in a step 218 shown in FIG. 12 to yield a characteristic period t. This value t represents the average time between frequency error pulses in the predominant polarity, i.e. the period of time after which the preset value of the preset counter 22 is to be incremented or decremented by one.

For example, if the number of output pulses derived from the loop filter 24 counted over five seconds is +20, the time t for the frequency error of the tracking pulse 100 to reach the minimum unit correction amount of 0.1 microseconds would be 0.25 (5/20) seconds.

Next, in a step 220, the MPU 26 calculates the integral number n of Loran pulse group repetition periods within the time t by dividing the time t by the local Loran Group Repetition Interval (GRI=0.0997 seconds in Japan area).

It should be noted that since, in the above-described example, since the time t is 0.25 seconds, this integer value n will be two.

Furthermore, the MPU 26 determines whether the remainder of the division of time t by the Loran group repetition interval (GRI) (i.e., t/GRI=n+remainder) is greater than half of the Loran electromagnetic wave group repetition interval in a step 222.

In this example, since the remainder is 0.0506 which is above half of the Loran electromagnetic wave group repetition interval (GRI/2=0.04985), the routine goes to a step 224 in which one is added to the above-described integer value n (n=n+1).

If the remainder is less than half of the Loran group repetition interval(GRI/2) in the step 222, the integer part n remains unchanged.

Figures 13A, 13B, 13C:
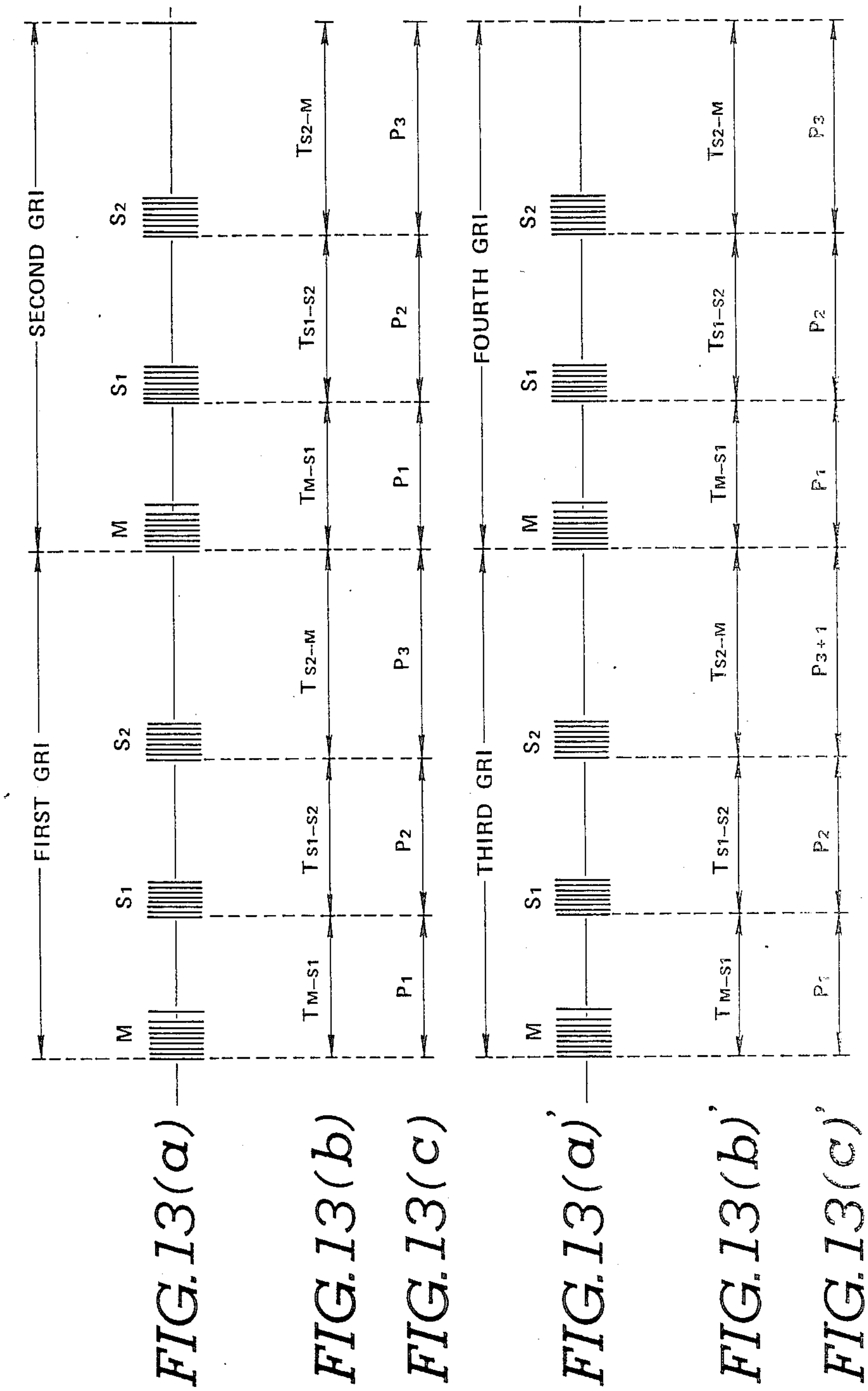
FIGS. 13(*a*) through 13(*c*)' are signal timing charts for explaining the frequency error correction operation.

When the repetition frequency n of the Loran pulse group within the calculated time t is calculated in the step 216, the routine goes to a step 226 (refer to FIG. 11(*a*)) in which a value $P_1$ (corresponding to the time difference $T_{M\text{-}S1}$ between receipts of the master station signal M and the first subsidiary station signal $S_1$ in a first GRI shown in FIG. 13 [first Loran group repetition interval]) is preset in the preset counter 22 in a step 226.

In a step 228, the present counter 22 is decremented stepwise to zero. In a step 230, the MPU 26 determines whether the value of the preset counter 22 reaches zero.

When the value thereof reaches zero in the step 230 (, i.e., at the time of expected receipt of the first subsidiary station signal $S_1$), the routine goes to a step 232, in which a value $P_2$ (corresponding to the time difference $T_{S1\text{-}S2}$ between receipt of the first subsidiary station signal $S_1$ and the second subsidiary station signal $S_2$) is preset in the preset counter 22.

In a step 234, the preset counter 22 is decremented stepwise to zero. When the value of the preset counter 22 reaches zero, i.e. at the time of expected receipt of the second subsidiary station signal $S_2$ in a step 236, the routine goes to a step 238 which checks to see if the present repetition interval (first GRI) is the repetition interval (a third GRI) corresponding to the number of intervals n (in this case, n=3) calculated in the processing routine shown in FIG. 11.

At this time, since the number of intervals n (interger part described above) is three, the routine passes the step 238 and goes to a step 240.

In the step 240, a value $P_3$ corresponding to the time difference $T_{S2\text{-}M}$ between receipts of the second subsidiary station signal $S_2$ in the first GRI shown in FIG. 13 and the master station signal M in the second GRI (third Loran group repetition interval) is preset in the preset counter 22.

After the preset counter 22 is counted down in a step 242 and the value of the preset counter reaches zero in a step 244, the loop of steps 226 through 244 is repeated for the second GRI of FIGS. 13(*a*) through 13(*c*).

The above-described loop is also executed for the third GRI (third Loran electromagnetic wave repetition interval) in FIGS. 13(*a*)' through 13(*c*)'. Since the number of intervals n is three (n=3), the MPU 22 recognizes that the third GRI is the interval at which the frequency error is to be corrected (Yes in the step 238).

In this case, as appreciated from FIGS. 13(*a*)' through 13(*c*)', the value $P_3$ (corresponding to the time difference $T_{S2\text{-}M}$ between receipts of the second subsidiary station signal $S_2$ in the third GRI (third Loran group repetition interval) and the master station signal M in a fourth GRI (Loran group repetition interval)) is incremented by one in a step 246.

Consequently, the tracking pulse 100 is adjusted by 0.1 microseconds (in other words, the tracking pulse frequency is shifted by 10 MHz).

In the fourth preferred embodiment described above, whenever the frequency error of the tracking pulse 100 reaches the minimum unit amount of correction (=0.1 microseconds) to its frequency error, the frequency (period) of the tracking pulse 100 is adjusted by its minimum unit amount of correction (0.1 microseconds) at a timing determined by the measured current frequency error.

Figure 14A:
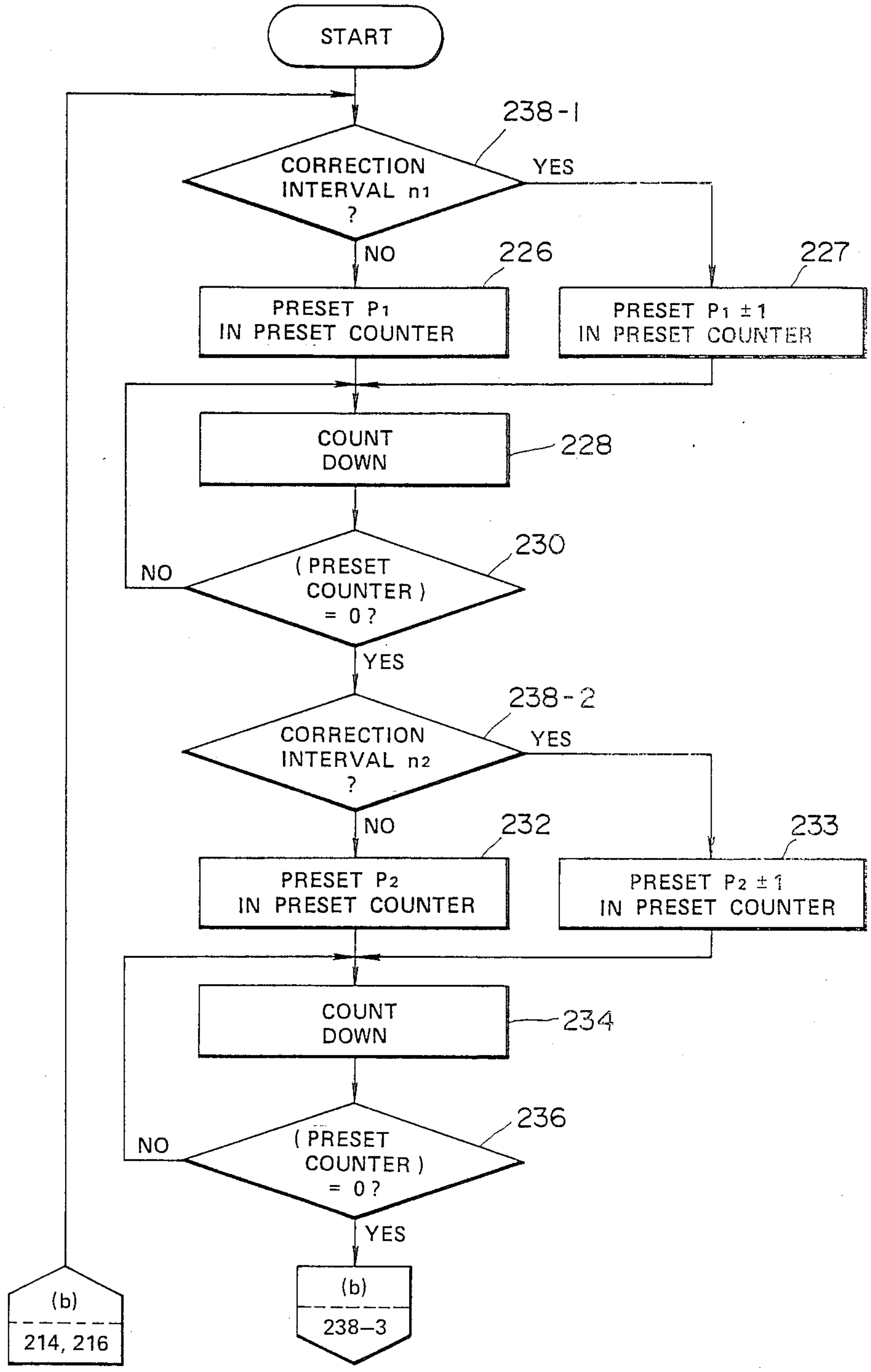
FIGS. 14(*a*) and 14(*b*) together form still another processing flowchart employed in a modification to the fourth preferred embodiment.
Figure 14B:
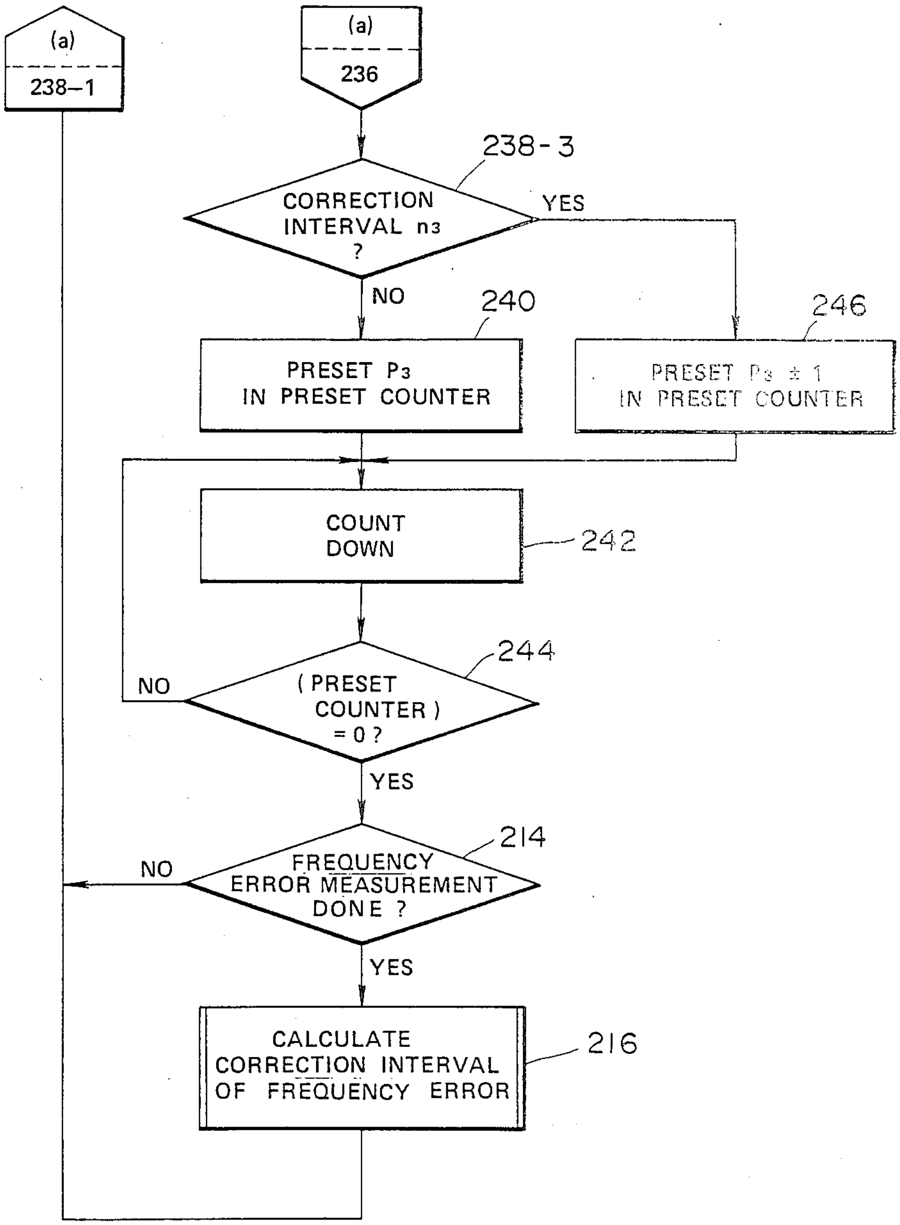

FIGS. 14(*a*) and 14(*b*) together form a processing flowchart which is a modification of FIGS. 11(*a*) and 11(*b*).

Figure 15:
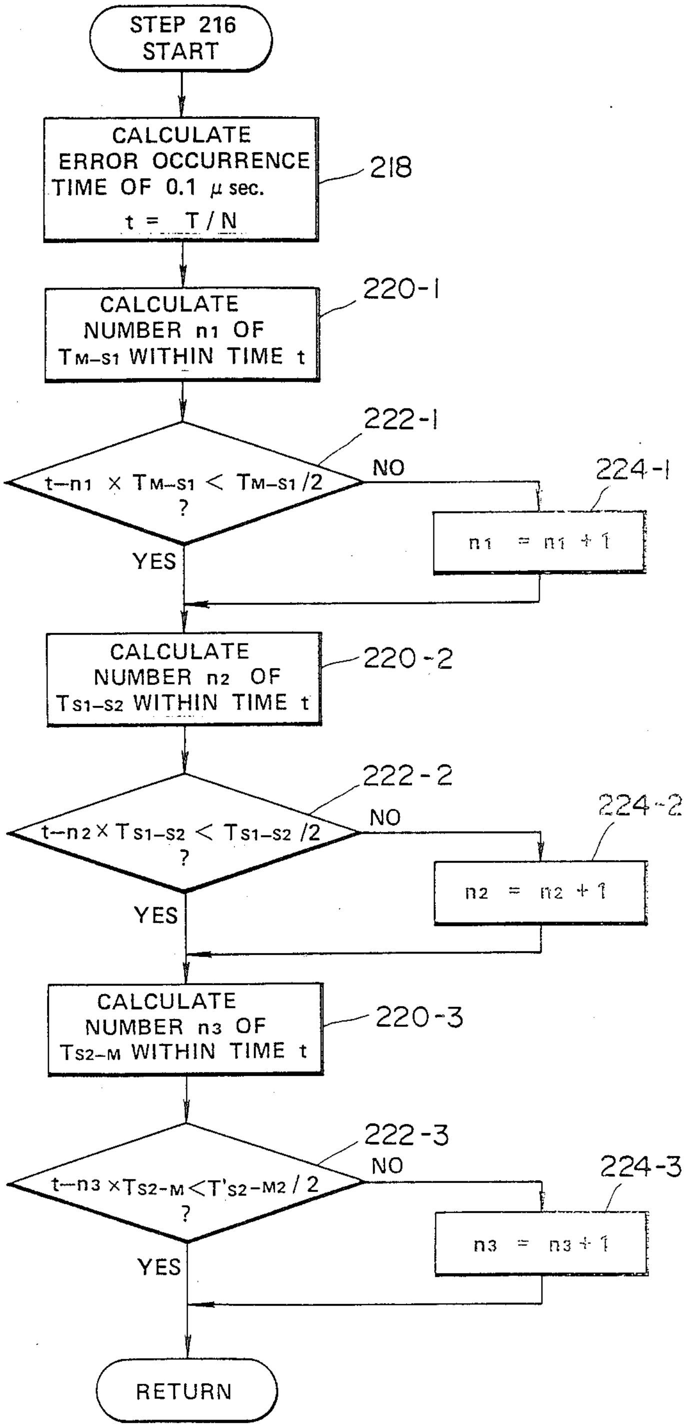
FIG. 15 is a still another processing flowchart for the step 216 of FIG. 14(*b*).

FIG. 15 shows another processing flowchart which is similarly a modification of FIG. 12.

In the processing routine of FIGS. 14(*a*) and 14(*b*), the number $n_1$ of GRI's within the period $T_{M\text{-}S1}$, the number $n_2$ of GRI's within the period $T_{S1\text{-}S2}$, and the number $n_3$ of GRI's within the period $T_{S2\text{-}M}$ are sequentially calculated in steps 220-1, 220-2, and 220-3.

In addition, if their respective remainders are above half of a Loran group repetition interval (negative results at steps 222-1, 222-2, and 222-3), these numbers $n_1$, $n_2$, and $n_3$ are incremented by one in steps 224-1, 224-2, and 224-3, respectively. If the remainders are below the half-interval value (positive results in steps 222-1, 222-2, and 222-3), these numbers $n_1$, $n_2$, and $n_3$ remain unchanged.

Furthermore, in the processing routine shown in FIGS. 14(*a*) and 14(*b*), the MPU 26 determines whether the interval in which the frequency error is to be corrected is reached before presettings any of the values $P_1$, $P_2$, and $P_3$ in steps 238-1, 238-2, and 238-3, respectively. Upon confirmation that the interval required for the above-described correction has been reached, the above-described values $P_1$, $P_2$, and $P_3$ are incremented or decremented by a value of one, respectively and are then preset in the preset counter 22. Thereafter, the frequency of the tracking pulse 100 is corrected for each period between receipt of signals from the above-described stations.

It should be noted that plus or minus sign attached to one (±) for presetting the preset counter 22 found in steps 246,227, and 233 dependes on a sign of the measured error value N. If the frequency of the clock pulse signal from the crystal oscillator 28 is higher than that of the tracked point, the measured error value N takes plus sign. If, on the other hand, the frequency of the clock pulse signal derived from the crystal oscillator 28 is lower than that of the tracked point, the measured value N takes minus sign. Therefore, plus one increment of the preset counter 22 indicates the minus sign of the measured error value N.

Hence, this modification to the fourth preferred embodiment makes a more precise correction of frequency of the tracking pulse 100 possible.

EFFECT OF THE INVENTION

As described hereinabove, the Loran-C signal receiving apparatus according to the present invention can continuously make accurate measurements of location without large errors due to cycle slip by correcting frequency errors in the pulse tracking of the received signal.

As described above, in the first preferred embodiment, the frequency error of the received signal tracking pulse is measured on the basis of the received signal, the measurement error due to noise is cancelled by accumulating the measured values, and the frequency of the tracking pulse for the received signal is corrected according to the accurately measured value of the frequency error.

In the second preferred embodiment, the frequency error of the tracking pulse frequency means "a" is derived from the tracking error of the pulse tracking the received signal and the frequency of the frequency means "a" is corrected on the basis of the detected frequency error of the tracking pulse frequency means a.

In the third preferred embodiment, the frequency error of the tracking pulse is detected on the basis of the received signal, the frequency is corrected according to the accumulated detection error, and furthermore, overcorrection of the frequency error is prevented. In this embodiment, accurate measurement of location can be achieved even if the received signal amplitude drops significantly.

In the fourth preferred embodiment, the frequency error of the tracking pulse is derived from the tracking error of the pulse tracking and the frequency of the tracking pulse is corrected according to the detected frequency error of the tracking pulse at calculated intervals.

It will clearly be understood by those skilled in the art that the foregoing description has been made in terms of preferred embodiments and various changes and modifications can be made without departing from the scope of the present invention.

What is claimed:

1. An apparatus comprising:
(a) first means for generating and outputting a pulse having a frequency and for tracking a particular cycle of a received carrier wave of a loran signal;
(b) second means for monitoring the frequency of the tracking pulse of the first means and deriving a frequency error thereof with respect to the received carrier wave signal on the basis of the tracking error of the tracking pulse; and
(c) third means for causing a position of the tracking pulse to reach a predetermined point of the carrier wave of the received Loran signal by correcting the frequency of the tracking pulse of the first means on the basis of the frequency error derived by the second means.

2. The apparatus according to claim 1, wherein said tracking pulse tracks the received carrier wave with the highest signal-to-noise ratio among those received carrier wave signals from signal transmission stations, said second means accumulates the derived frequency error values over a given length of time, and the third means corrects the frequency using the frequency errors accumulated by the second means.

3. The apparatus according to claim 1, further comprising fourth means for measuring the signal-to-noise ratio of the received carrier waves of the Loran signal and determining whether the signal-to-noise ratio exceeds a predetermined value and wherein said tracking pulse tracks the received carrier wave signal with the highest signal-to-noise ratio among those received from target signal transmission stations, and, wherein second means derives the frequency error when the forth means determines that the signal-to-noise ratio exceeds the predetermined value.

4. The apparatus according to claim 1, wherein said second means comprises:
(a) fourth means for comparing the phase of the received carrier wave with that of the tracking pulse to detect the tracking error of the tracking pulse with respect to the received carrier wave;
(b) fifth means for deriving the frequency error from the detected tracking error; and
(c) sixth means for accumulating frequency errors
and wherein said third means corrects the frequency of the first means according to the accumulated frequency error when the tracking error is within an allowable range.

5. The apparatus according to claim 1, further comprising fourth means for deriving an interval at which the frequency is to be corrected on the basis of the frequency error derived by the second means and wherein said third means corrects the frequency of the first means according to the frequency error derived by the second means at the interval derived by the fourth means.

6. An apparatus comprising:
(a) first means for comparing the phase of a received carrier wave of a Loran singal with that of a pulse tracking a particular cycle of the received signal;
(b) second means for receiving an output comparison signal from the first means and outputting a pulse corresponding to a predetermined tracking pulse time position error of the tracking pulse with respect to a time position of the particular cycle of the received carrier wave signal;
(c) third means for generating pulses at a constant, adjustable frequency;
(d) fourth means for selecting a preset value according to the number of output pulses from the second means; and
(e) fifth means, a preset value thereof being selected by the fourth means, for counting the pulses generated by the third means up to the preset value and outputting the tracking pulse to the first means when the number of pulses counted reaches the preset value thereby to provide coincidence of the time positions of the tracking pulse and the particular cycle of the received carrier wave.

7. The apparatus according to claim 6, wherein said fourth means comprises:
(a) sixth means for counting the number of pulses derived from said second means over a predetermined interval of time;
(b) seventh means for accumulating the counts of pulses from said second means each time the predetermined interval of time has passed;
(c) eighth means for calculating the frequency error of the tracking pulse on the basis of the accumulated counts of pulses; and
(d) ninth means for adjusting the preset value of said fifth means according to the calculated frequency error so as to cancel the calculated frequency error.

8. The apparatus according to claim 7, wherein said eighth means calculates the frequency error from the following equation:

$$E = \frac{N \times M}{\text{predetermined interval of time}},$$

wherein N denotes the accumulated counts of pulses and M denotes a control unit amount by which the frequency of the tracking pulse is adjusted.

9. The apparatus according to claim 8, wherein the control unit amount for shifting the frequency of the tracking pulse is determined according to the ratio of the increment used by said fifth means to the predetermined frequency of said third means.

10. The apparatus according to claim 9, wherein said third means is a crystal oscillator.

11. The apparatus according to claim 8, wherein the control unit amount for shifting the frequency of the tracking pulse is approximately 0.4 microseconds.

12. The apparatus according to claim 7, further comprising: tenth means for selecting one of a plurality of target Loran-C signal transmission stations, the transmitted Loran-C signal of which is received at the highest signal-to-noise ratio; eleventh means for detecting the speed of a moving object on which the apparatus is mounted; and twelfth means for determining whether it is possible to use the received signal from the selected transmission station as a detection criterion of the frequency error of the tracking pulse on the basis of the detected speed by said eleventh means and wherein said sixth means starts the counting when said twelfth means determines that it is possible to use the received signal from the selected station.

13. The apparatus according to claim 7, wherein said predetermined interval of time is set so as to avoid the occurrence of a cycle slip phenomenon.

14. The apparatus according to claim 13, wherein said predetermined interval of time is approximately five seconds.

15. The apparatus according to claim 7, further comprising: tenth means for determining whether the frequency error calculated by said eighth means will exceed a predetermined value after the subsequent predetermined interval of time each time the predetermined interval of time passes; and eleventh means for disabling the counting of the number of pulses from said second means for the subsequent predetermined interval of time when said tenth means determines that the calculated frequency error will exceed the predetermined value after the subsequent predetermined interval of time.

16. The apparatus according to claim 15, wherein said ninth means varies the preset value of said fifth means according to the calculated frequency error for the previous predetermined interval of time when said tenth means determines that the calculated frequency error will exceed the predetermined value after the subsequent predetermined interval of time.

17. The apparatus according to claim 7, further comprising tenth means for calculating a point in time at which said ninth means adjusts the preset value of said fifth means according to the calculated frequency error and wherein said ninth means adjusts the preset value of said fifth means when the calculated point in time is reached.

18. The apparatus according to claim 17, wherein said tenth means comprises: (a) eleventh means for calculating the quotient ($t=T/N$) of the predetermined interval of time (T) and the number of pulses from said second means (N) over the predetermined interval of time to derive a time (t) at which the frequency error of the tracking pulse is to be adjusted by a minimum frequency correction amount; (b) twelfth means for calculating the quotient of the calculated time (t) and a predetermined Loran-C group repetition interval (GRI) to derive an integer number (n) of the predetermined Loran-C group repetition intervals (GRI) within the calculated time t; (c) thirteenth means for determining whether the remainder of the quotient calculated by said twelfth means exceeds one-half of the group repetition interval (GRI/2); and (d) fourteenth means for adding one to the derived integer number (n) when the remainder of the quotient exceeds one-half of the group repetition interval (GRI/2), whereby the point in time at which said ninth means adjusts the preset value of said fifth means by one, corresponding to the minimum frequency correction amount, is calculated from the integer number of intervals (n).

19. The apparatus according to claim 18, wherein said fourth means presets a first value ($P_1$) in said fifth means, the first value ($P_1$) corresponding to a time difference ($T_{M\text{-}S1}$) between receipt of a master station signal (M) and first subsidiary station signal (S1) of a firt Loran-C group repetition interval (GRI), and said fifth means decrements said first value in response to the pulses generated by said third means until zero, next said fourth means presets a second value ($P_2$) in said fifth means, the second value ($P_2$) corresponding to a time difference ($T_{S1\text{-}S2}$) between receipt of the first subsidiary station signal (S1) and a second subsidiary station signal (S2) of the first GRI, and said fifth means decrements said second value in response to the pulses generated by said third means until zero, thereafter said fourth means presets a third value ($P_3$) in said fifth means, the third value ($P_3$) corresponding to a time difference ($T_{S2\text{-}M}$) between receipt of the second subsidiary station signal (S2) of the first GRI and the master station signal (M) of a second GRI, and said fifth means decrements said third value in response to pulses generated by said third means until zero.

20. The apparatus according to claim 19, further comprising: sixteenth means for determining whether the current Loran-C group repetition interval (GRI) corresponds to the integer number of intervals (n) derived by said tenth means; said seventeenth means for adding plus and minus one ($\pm 1$) to the third value ($P_3$) to correct the frequency of the tracking pulse when said sixtheenth means determines that the current GRI corresponds to the integer number of intervals (n).

21. The apparatus according to claim 17, wherein said tenth means comprises: (a) eleventh means for calculating the quotient ($t=T/N$) of the predetermined interval of time (T) and the number of pulses from said second means (N) over the predetermined interval of time to drive a time (t) at which the frequency error of the tracking pulse is to be adjusted by a minimum frequency correction amount; (b) twelfth means for calculating the quotient of the calculated time (t) and the time difference ($T_{M\text{-}S1}$) between receipt of a master transmission station signal (M) and of a first subsidiary station signal (S1) to derive a first integer number (n1) of the predetermined Loran-C group repetition intervals (GRI); (c) thirteenth means for calculating the quotient of the calculated time (t) and the time difference ($T_{S1\text{-}S2}$) between receipt of the first subsidiary station signal (S1) and of a second subsidiary station signal (S2) to derive a second integer number (n2) of GRI's; (d) fourteenth means for calculating the quotient of the calculated time (t) and the time difference ($_{S2\text{-}M}$) between receipt of the second subsidiary station signal (S2) and the master station signal (M) of the subsequent GRI to derive a third integer number (n3) of GRI's; (e) fifteenth means for determining whether the inequalities: $t-n1\times(T_{M\text{-}S1})\geqq T_{M\text{-}S1}/2$; $t-n2\times(T_{S1\text{-}S2})\geqq T_{S1\text{-}S2}/2$; and $t-n3\times(T_{S2\text{-}M})\geqq T_{S2\text{-}M}/2$ are respectively satisfied; and (f) sixteenth means for adding one to any and all of the first, second, and third integer numbers (n1, n2, or n3) for which said fifteenth means determines that the corresponding inequality is satisfied.

22. The apparatus according to claim 21, further comprising seventeenth means for determining whether the current Loran-C group repetition interval (GRI) corresponds to any one of the first, second, and third integer numbers (n1, n2, or n3) and eighteenth means for adding plus and minus one ($\pm 1$) to the value ($P_1$, $P_2$, or $P_3$) which corresponds to the time difference ($T_{M\text{-}S1}$, $T_{S2\text{-}S2}$, or $T_{S2\text{-}M}$) between receipt of the master station signals (M), the first subsidiary station signal (S1), and the second subsidiary station signal (S2) when said seventeenth means recognizes that the current GRI corresponds to a corresponding one of the first, second and third integer numbers (n1, n2, or n3).

23. The apparatus according to claim 6, wherein said second means comprises a loop filter having a control constant adjusted according to the signal-to-noise ratio of the received carrier wave.

24. The apparatus according to claim 6, further comprising:

sixth means for measuring the signal-to-noise ratio of the received signal and outputting a signal when the measured signal-to-noise ratio exceeds a predetermined value and wherein said fourth means controls the preset value of said fifth means in response to the signal from said sixth means.

25. A Loran-C signal receiving apparatus for a vehicle, comprising:

(a) first means for generating a frequency signal and outputting a pulse tracking a third cycle of a carrier wave of a received Loran-C signal;

(b) second means for monitoring the frequency of the first means and deriving the error thereof with respect to the third cycle of the carrier wave of the received Loran-C signal on the basis of the tracking error of the tracking pulse;

(c) third means for causing a position of the tracking pulse to reach a predetermined point of the carrier wave of the received Loran-C signal by correcting the frequency of the first means on the basis of the frequency error derived by the second means; and (d) fourth means for measuring a point of location of the vehicle in which the apparatus is mounted on the basis of time differences between receipts of a master station transmission signal and at least two subsidiary station transmission signals, these received Loran-C signals being tracked by the tracking pulse whose frequency is being corrected by said third means.

26. The applaratus according to claim 25, wherein said tracking pulse tracks the received signal with the highest signal-to-noise ratio among those received signals from master and two subsidiary transmission stations, said second means accumulates the derived error values over a given length of time and the third means corrects the frequency using the errors accumulated by the second means.

27. The apparatus according to claim 25, further comprising fifth means for measuring the signal-to-noise ratio of the received master and subsidiary station transmission signals and determining whether the signal-to-noise ratio exceeds a predetermined value and wherein said tracking pulse tracks the third cycle of each received Loran-C signal with the highest signal-to-noise ratio among those received from the master and two subsidiary transmission stations, and wherein the second means derives the error when the fifth means determines that the signal-to-noise ratio thereof exceeds the predetermined value.

28. The apparatus according to claim 25, wherein said second means comprises:

(a) fifth means for comparing the phase of the third cycle of the carrier wave of the received Loran-C signal with that of the tracking pulse to detect the tracking error of the tracking pulse with respect to the third cycle of the carrier wave of the received Loran-C signal;

(b) sixth means for deriving the error from the detected tracking error; and (c) seventh means for accumulating errors, and wherein said third means corrects the frequency of said first means according to the accumulated error when the tracking error is within an allowable range.

29. The apparatus according to claim 25, further comprising fifth means for deriving an interval at which the frequency is to be corrected on the basis of the error derived by the second means and wherein said third means corrects the frequency of the first means according to the error derived by the second means at the interval derived by the fifth means.

* * * * *